United States Patent [19]

Kuhns

[11] Patent Number: 4,529,931
[45] Date of Patent: Jul. 16, 1985

[54] SINGLE-COIL CURRENT MEASURING CIRCUIT

[75] Inventor: Kenneth A. Kuhns, Taylor, Mich.

[73] Assignee: Ford Motor Company, Dearborn, Mich.

[21] Appl. No.: 483,019

[22] Filed: Apr. 7, 1983

[51] Int. Cl.³ .............................................. G01R 19/00
[52] U.S. Cl. ................................ 324/117 R; 324/127; 332/12
[58] Field of Search .................. 324/127, 117 R, 99 R, 324/99 D, 142; 332/12

[56] References Cited

U.S. PATENT DOCUMENTS

| | | | |
|---|---|---|---|
| 3,801,907 | 4/1974 | Lilienstein | 324/117 R |
| 3,818,337 | 6/1974 | Groenenbroom et al. | 324/127 |
| 4,274,052 | 6/1981 | Gentry et al. | 324/117 R |
| 4,276,510 | 6/1981 | Tompkins et al. | 324/127 |
| 4,278,938 | 7/1981 | Morriss | 324/117 R |

FOREIGN PATENT DOCUMENTS 763576 7/1967 Canada .
2030542 12/1971 Fed. Rep. of Germany ... 324/117 R Primary Examiner—Stewart J. Levy
Assistant Examiner—Stephen M. Baker
Attorney, Agent, or Firm—Paul K. Godwin, Jr.; Robert D. Sanborn

[57] ABSTRACT

A single-coil wound on a ferrite core surrounding a current path is driven from a voltage controlled constant current source. The coil drive current is modulated with a fixed frequency squarewave. The average voltage present across the coil is sensed and integrated to provide an output signal which is proportional to the current flow and also provides a negative feedback to the voltage controlled current source to bias the modulated drive current in a direction which compensates for the biasing effects of the current flowing in the conductive path.

10 Claims, 2 Drawing Figures

SINGLE-COIL CURRENT MEASURING CIRCUIT

BACKGROUND OF THE INVENTION

1. Field of the Invention

The present invention is directed to the field of DC and low frequency AC current measuring by sensing the intensity of the resultant magnetic field produced by the flow of current in a conductive path.

2. Description of the Prior Art

Non-contacting current measuring instruments have been developed in the past which utilize complex sensing pickups with several cores and several windings for excitation sensing and feedback.

U.S. Pat. No. 3,801,907 illustrates a direct current measuring device utilizing two pair of cores with multiple control windings, bias windings and feedback windings to perform measurements with saturated core excitation.

U.S. Pat. No. 4,274,052 utilizes a single winding on each core wherein each winding is sinewave voltage excited for core saturation. Circuitry is shown for the detection of the second harmonic of the excitation frequency. A manual adjustment is also utilized to provide the feedback necessary to null the effects of the unknown current.

U.S. Pat. No. 4,276,510 illustrates a measuring device in which separate excitation and feedback windings are used along with a phase detection method that is implemented using squarewave voltage excitation.

U.S. Pat. No. 4,278,938 illustrates a current measuring device in which a plurality of windings are used on a single core for excitation and feedback. A voltage pulse excitation method is used to detect the value of the unknown current.

Canadian Pat. No. 763,576 illustrates an electrical current measuring apparatus which utilizes a pair of cores and three windings. By utilizing voltage excitation, the cores are excited into saturation and the second harmonic of excitation frequency is detected.

Japanese Pat. No. 54-97730 illustrates a current detection circuit utilizing two windings plus a split-gap flux detector to perform the DC current measurement.

SUMMARY OF THE INVENTION

The present invention is a highly accurate and low-cost device that has been found to be sufficiently sensitive enough to measure direct current from less than 100 μa to more than 1 amp. It has also been found suitable for measuring AC currents at frequencies below 100 Hz. The present invention achieves the above results by providing a single coil winding on a ferromagnetic core coupled with the measured current flow. The single coil functions as both the exciting and the sensing coil. Excitation is achieved by driving the coil from a current source. The current source is a voltage controlled type that is connected to receive a constant frequency squarewave signal for modulating the driving current. The electromagnetic field produced by the measured current flow is coupled to the ferromagnetic core and biases the voltage drop across the winding by an amount which is proportional to that current flow in the conductive path. The present inventtion measures the average voltage drop across the sensing coil and provides a feedback voltage to the voltage controlled current source to bias the modulated drive current in a manner so as to restore the average voltage drop across the sensing coil to zero. The feedback voltage also serves as an output signal that is proportional to the measured current flowing in the conductive path.

DETAILED DESCRIPTION OF THE PREFERRED EMBODIMENT

Figure 1:
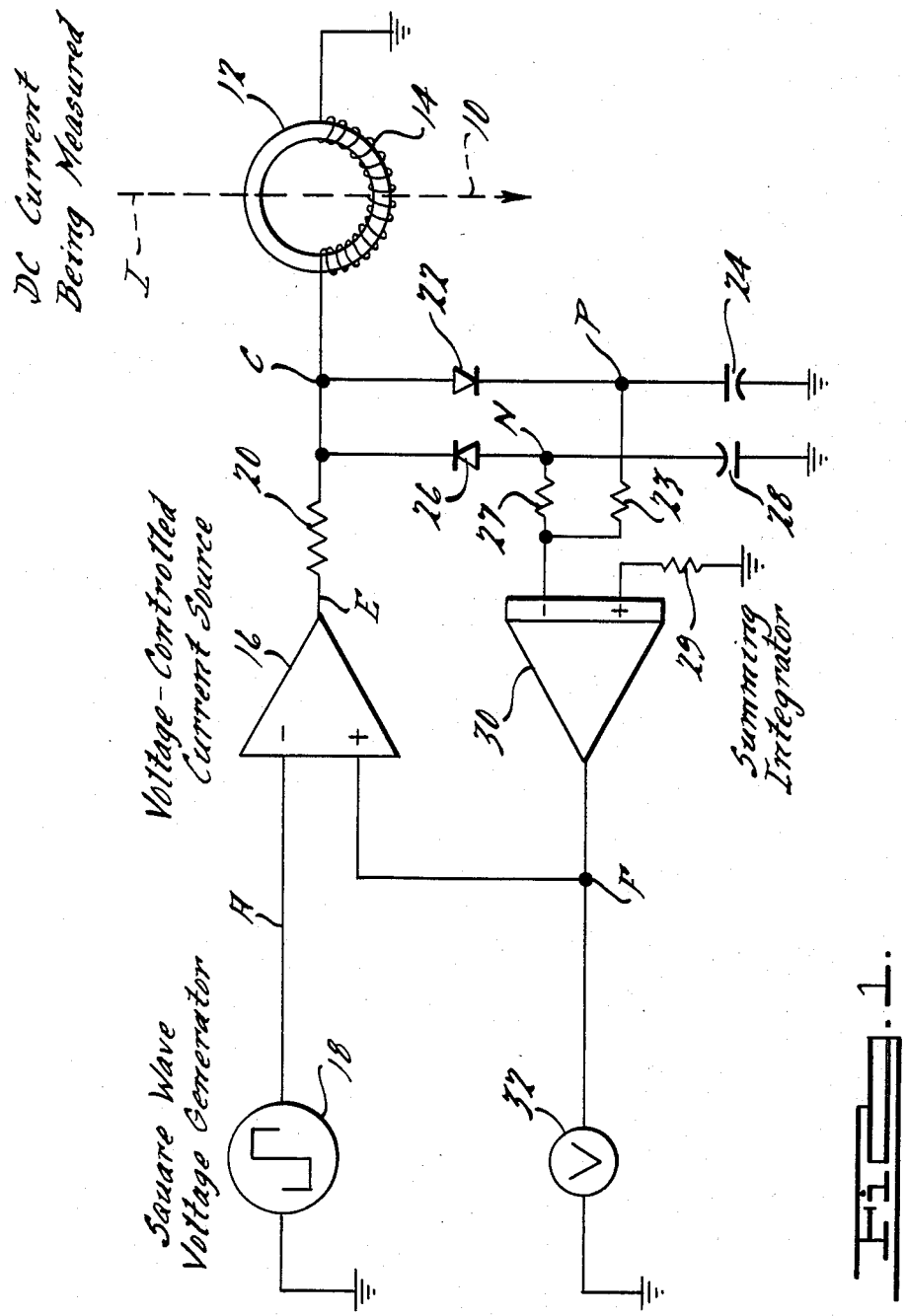
FIG. 1 is a diagram illustrating the electrical configuration of the present invention.

In FIG. 1, an electrical current flow I is represented by the dash line along a conductive path 10. The current may be in the form of an electron of ion beam or an electrically sourced current flowing on a conductor. In any event, the current I is known to produce an electromagnetic field that surrounds the conductive path 10. The present invention utilizes a single ferromagnetic core 12 which is shown to be in the form of a solid toroid positioned to surround the conductive path of the measured current I, so as to be coupled with the electromagnetic field generated thereby. The core 12 may also be formed as a discontinuous element containing a gap to allow insertion and removal of the conductive path element that is to be measured. In any event, the core 12 provides a closed path to contain the electromagnetic field surrounding the conductive path 10.

A single sensing coil 14 is wound around a portion of the core 12. The sensing coil 14 has one end grounded and the other end is connected, through a resistor 20, to a voltage controlled current source 16. An excitation drive current "E" (FIG. 2) is supplied to the sensing coil 14 from the current source 16. The current is modulated with a squarewave signal "A" of a predetermined and constant frequency and constant amplitude. The squarewave is supplied to the current source 16 by a squarewave voltage generator 18. The amplitude of the squarewave modulating signal from the generator 18 is selected so that the resultant drive current supplied to coil 14 will be below magnetic saturation.

A positive peak detector circuit including a rectifying diode 22 and a capacitor 24 are connected across the sensing coil 14 in order to rectify and accumulate charge according to the voltage level present on the drive coil above a predetermined reference value. Likewise a negative peak detector circuit is connected in parallel with the positive peak detector circuit and comprises a diode 26 and a storage capacitor 28 configured to rectify and accumulate charge according to the voltage dropped across the sensing coil 14 that is below the predetermined reference level. The accumulated voltage levels "P" and "N" on the capacitors 24 and 28 are summed through resistors 23 and 27 at the negative input port of a summing integrator 30. The summed voltage at the negative input port reflects the average voltage present on the sensing coil 14. The positive input port of the summing integrator 30 is grounded through a resistor 29 to establish a comparative reference level at ground potential. The output voltage "F" from the summing integrator 30 is provided as a negative feedback signal to the voltage control current source 16 to bias the modulated drive current supplied to the sensing coil 14. The output "F" of the summing integrator 30 also provides the output signal which is a DC voltage representation proportional to the measured current I flowing in the conductive path 10. Of course, any low frequency AC components present in the current I will also be present in the output "F" and may be extracted by appropriate means.

In operation, when the measured current I is at a zero level, the excitation drive current is provided to the sensing coil 14 in equal positive and negative amounts so that the average voltage drop across the sensing coil 14 is zero volts. The accumulated voltages at points "N" and "P" are therefore, of equal and opposite values so that the summing at the negative input port of summing integrator 30 results in a zero voltage to be integrated by that circuit. The output signal from the summing integrator is also at the zero level and does not provide a biasing voltage to influence the output of the current source.

Figure 2:
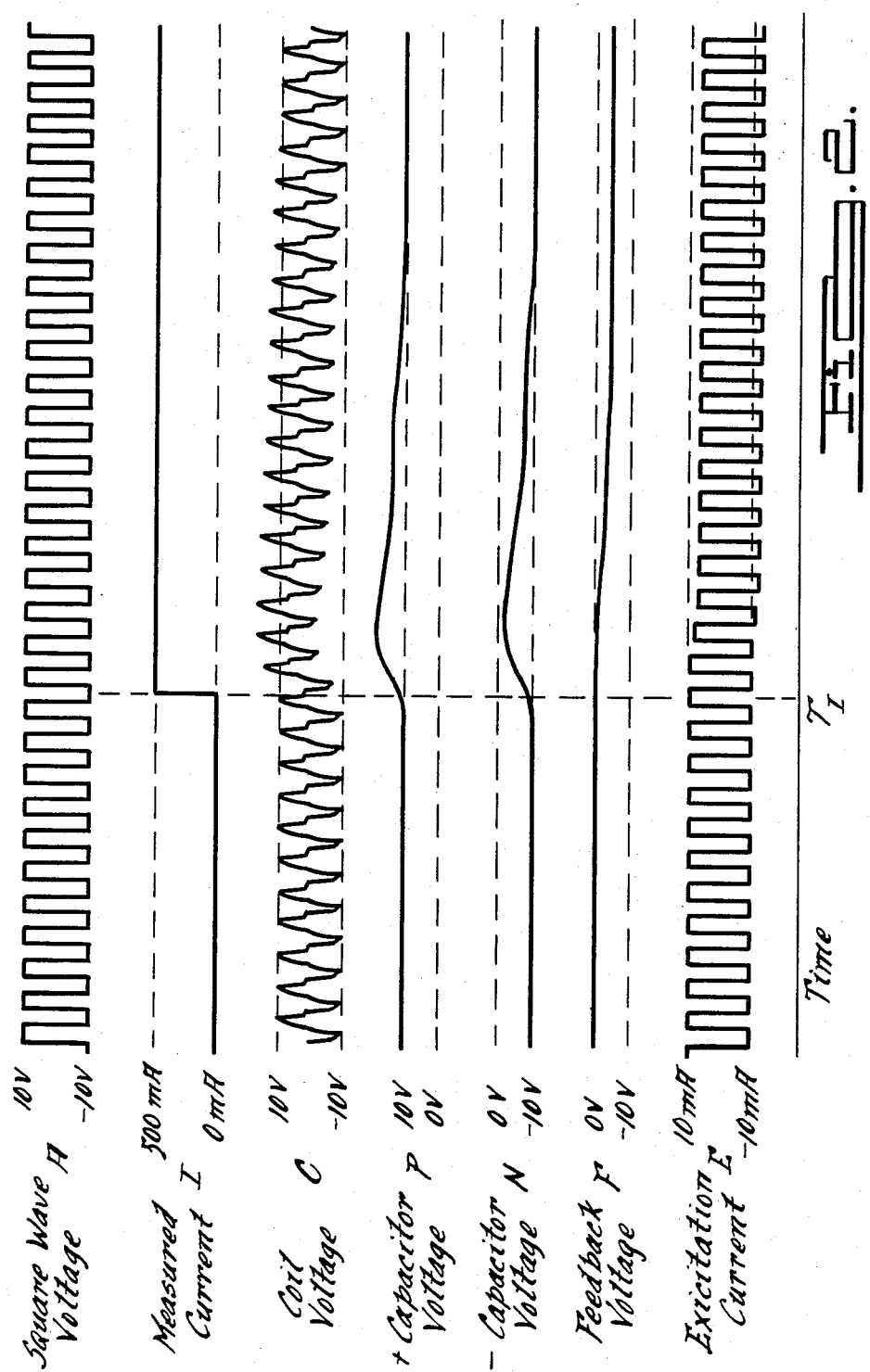
FIG. 2 is a plurality of signal waveforms illustrating the response of the present invention at various points in the circuit.

As shown in FIG. 2, a time point $T_I$ illustrates the instant when an example of a current I starts to flow along the conductive path 10. For illustration purposes, the measured current I is stepped from a value of zero to 500 milliamps. As a result of the current I flowing in the path 10, the electromagnetic field generated by that current influences the magnetic field flowing in the core 12 due to the excitation drive current and proportionally biases the voltage drop across the sensing coil 14. The direction of bias is determined by the direction of current I flowing in the conductive path 10.

It can be seen in FIG. 2, immediately following $T_I$, that the coil voltage "C" is biased in a positive direction. As a result of the shift in the coil voltage "C", the level of charge stored on the capacitors 24 and 28 also changes. The charge level on capacitor 28 decreases by the same amount that charge level on capacitor 24 increases. This is due to the fact that the AC voltage level on the sensing coil 14 was shifted with respect to a reference, rather than changed in amplitude. The resultant sum of the voltages at the negative input port of the summing integrator 30 shifts positive with respect to the reference level at the positive input port and produces a feedback voltage "F". The voltage "F" is applied to the negative input port of the voltage control current source 16 to negatively bias the excitation current "E" and thereby restore the voltage drop across sensing coil 14 to its original level and thereby compensate for the biasing contributed by the electromagnetic field of the current I flowing in the conductive path 10. Of course, when the voltage across sensing coil 14 is restored to normal, the voltage levels present on capacitors 24 and 28 are also returned to equal and opposite levels to provide a zero sum at the negative input port of the summing integrator 30. When the input voltages present on the summing integrator 30 are equal, the feedback voltage "F" is maintained at its previous integrated level, while the I remains unchanged.

The volt meter 32 represented in FIG. 1 measures the level of the feedback voltage "F" and proportionally indicates the level of measured current flow I in the conductive path 10.

It will be readily apparent that many modifications and variations may be implemented without departing from the scope of the novel concept of this invention. Therefore, it is intended by the appended claims to cover all such modifications and variations which fall within the true spirit and scope of the invention.

I claim:

1. A circuit for measuring the flow of electrical current in a conductive path comprising:
    a magnetic field core positioned to surround said conductive path;
    a coil of wire wound on said core;
    means for supplying a controlled current to drive said coil;
    means for providing a squarewave signal applied to said current generating means at a predetermined amplitude and frequency to modulate said drive current below the saturation level of said core;
    means for sensing the average voltage level present at said coil and generating an output voltage that is an integrated representation of the average sensed voltage level, wherein said output voltage is supplied to said drive current supplying means for biasing said modulated drive current in a direction that restores the average voltage level to a null and further wherein said output voltage is proportional to the level of the electrical current flowing in said conductive path.

2. A circuit as in claim 1, wherein said squarewave signal providing means generates said squarewave signal to have a constant amplitude above and below a predetermined reference voltage.

3. A circuit as in claim 2, wherein said reference voltage is at a ground potential.

4. A circuit as in claim 1, wherein said sensing means includes first means for rectifying and accumulating the voltage on said coil above a predetermined reference and a second means for rectifying and accumulating the voltage on said coil below said predetermined reference and;
    means separately connected to said first and second rectifying and accumulating means for integrating the difference between the accumulated voltages to generate said output voltage.

5. A circuit as in claim 1, wherein said controlled current supply means is separately connected to said squarewave signal providing means and said sensing means for supplying a controlled drive current to said coil that is modulated and biased as a function of a sum of said squarewave and said output signal.

6. A circuit as in claim 4, wherein said controlled current supply means is separately connected to said squarewave signal providing means and said sensing means for supplying a controlled drive current to said coil that is modulated and biased as a function of a sum of said squarewave and said output signal.

7. A circuit as in claim 6, wherein said squarewave is generated at a constant amplitude and frequency.

8. A device for measuring the flow of electrical current in a conductive path comprising:
    means providing a closed magnetic field path around said conductive path and positioned so as to be coupled with the magnetic field generated by said electrical current flow in said conductive path;
    means defining a coil around a portion of said closed magnetic field path;
    means connected across said coil for electrically driving said coil with a d.c. current that is squarewave modulated at a constant amplitude and frequency and that is biased with respect to a predetermined reference level so as to compensate for the biasing effects of said coupled magnetic field due to said electrical current flowing in said conductive path;
    means for sensing the average voltage level present across said coil and supplying said output signal, representing an integration of said average voltage level, to said driving means for proportionally biasing said squarewave modulating current and also representing the level of electrical current flow in said conducting path to an output terminal.

9. A device as in claim 8, wherein said magnetic field path means is a toroidal core and said coil means includes a length of wire wound around a portion of said core.

10. A device as in claim 8, wherein said driving means includes a voltage controlled current source circuit and a squarewave generator circuit which produces an unbiased squarewave signal of constant amplitude and frequency and wherein said current source circuit has a first input port connected to receive said signal from said squarewave generator circuit and a second input port connected to receive said sensing means output signal to proportionally bias said squarewave modulated current in a direction to restore the average voltage level present across said coil to a zero level.

* * * * *